(12) United States Patent
Son et al.

(10) Patent No.: US 7,783,467 B2
(45) Date of Patent: Aug. 24, 2010

(54) METHOD FOR DIGITAL SYSTEM MODELING BY USING HIGHER SOFTWARE SIMULATOR

(75) Inventors: Jung-Bo Son, Masan (KR); Hee-Jung Yu, Daejeon (KR); Eun-Young Choi, Daejeon (KR); Chan-Ho Yoon, Seoul (KR); Il-Gu Lee, Seoul (KR); Deuk-Su Lyu, Daejeon (KR); Tae-hyun Jeon, Sungnam (KR); Seung-Wook Min, Seoul (KR); Kwhang-Hyun Ryu, Daejeon (KR); Kyoung-Ju Noh, Daejeon (KR); Yun-Joo Kim, Daejeon (KR); Kyoung-Hee Song, Jeonju (KR); Sok-Kyu Lee, Daejeon (KR); Seung-Chan Bang, Daejeon (KR); Seung-Ku Hwang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 753 days.

(21) Appl. No.: 11/636,506

(22) Filed: Dec. 11, 2006

(65) Prior Publication Data

US 2007/0162269 A1 Jul. 12, 2007

(30) Foreign Application Priority Data

Dec. 10, 2005 (KR) .................... 10-2005-0121357
Apr. 11, 2006 (KR) .................... 10-2006-0032587

(51) Int. Cl.
*G06F 17/50* (2006.01)
*G06F 9/45* (2006.01)

(52) U.S. Cl. ............................. 703/19; 703/13; 703/14; 703/15; 703/16; 703/17; 717/131; 717/134; 717/135; 717/136; 717/137; 717/140; 716/1; 716/6; 716/18

(58) Field of Classification Search ............... 703/1–17, 703/19, 193; 716/1, 6, 18; 717/131, 135, 717/136, 137, 140
See application file for complete search history.

(56) References Cited

U.S. PATENT DOCUMENTS

| 5,202,642 | A | * | 4/1993 | Dixon | 327/105 |
| 5,426,378 | A | * | 6/1995 | Ong | 326/39 |
| 5,457,718 | A | * | 10/1995 | Anderson et al. | 375/373 |
| 5,634,115 | A | * | 5/1997 | Fitzpatrick et al. | 716/3 |
| 5,870,585 | A | * | 2/1999 | Stapleton | 703/15 |
| 5,973,529 | A | * | 10/1999 | Chappell et al. | 327/200 |
| 6,175,929 | B1 | * | 1/2001 | Hsu et al. | 713/500 |

(Continued)

FOREIGN PATENT DOCUMENTS

JP 11-213031 8/1999

(Continued)

*Primary Examiner*—Kamini S Shah
*Assistant Examiner*—Kibrom Gebresilassie
(74) *Attorney, Agent, or Firm*—Lowe Hauptman Ham & Berner LLP

(57) ABSTRACT

A digital system design method uses a higher programming language. In order to realize a digital system, an algorithm is verified based on a program written by the higher programming language and a program is programmed considering the higher programming language-hardware characteristics before the program is written in the lower programming language, and thus conversion into the lower programming language may be easily performed.

7 Claims, 5 Drawing Sheets

U.S. PATENT DOCUMENTS

| | | | |
|---|---|---|---|
| 6,226,776 B1 | 5/2001 | Panchul et al. | |
| 6,782,354 B1* | 8/2004 | Ikegami | 703/2 |
| 6,817,012 B1* | 11/2004 | Zammit et al. | 717/136 |
| 6,952,825 B1 | 10/2005 | Cockx et al. | |
| 7,146,300 B2* | 12/2006 | Zammit et al. | 703/13 |
| 7,331,024 B2* | 2/2008 | Sato et al. | 716/4 |
| 7,437,701 B1 | 10/2008 | Dutra et al. | 716/18 |
| 7,493,578 B1* | 2/2009 | Milne et al. | 716/5 |
| 7,528,665 B2* | 5/2009 | Coppola et al. | 331/2 |
| 2002/0029772 A1* | 3/2002 | Isaac et al. | 123/564 |
| 2002/0083420 A1* | 6/2002 | Zammit et al. | 717/135 |
| 2002/0108092 A1* | 8/2002 | Yasuda | 716/1 |
| 2002/0133788 A1* | 9/2002 | Waters et al. | 716/3 |
| 2002/0191725 A1* | 12/2002 | Dellow | 375/374 |
| 2003/0046668 A1* | 3/2003 | Bowen | 717/131 |
| 2003/0061580 A1* | 3/2003 | Greaves | 716/4 |
| 2003/0216901 A1* | 11/2003 | Schaumont et al. | 703/13 |
| 2004/0108876 A1* | 6/2004 | Fairbanks | 327/141 |
| 2004/0133861 A1* | 7/2004 | Bollano et al. | 716/4 |
| 2004/0143813 A1 | 7/2004 | Hanma | |
| 2004/0163072 A1* | 8/2004 | Levy | 717/106 |
| 2004/0196719 A1* | 10/2004 | Aritomi et al. | 365/222 |
| 2006/0015855 A1* | 1/2006 | Kumamoto | 717/136 |
| 2008/0191750 A1* | 8/2008 | Wang | 327/106 |
| 2008/0301606 A1* | 12/2008 | Law et al. | 716/6 |
| 2009/0064113 A1* | 3/2009 | Langman et al. | 717/148 |
| 2009/0182545 A1* | 7/2009 | Walter et al. | 703/15 |
| 2009/0217068 A1* | 8/2009 | Fernsler et al. | 713/322 |

FOREIGN PATENT DOCUMENTS

| | | |
|---|---|---|
| JP | 2000-011022 | 1/2000 |
| JP | 2001-209556 | 8/2001 |

* cited by examiner

FIG.2

```
do {
    clock_generator;
    clocked_latch;
    Phy_top;
} while(!end_of_input_event)
```

FIG.4

```
if(pedgeclk32) {
    A_D = A + B ;
}
```

FIG.5

```
if(pedgeuclk32) {
    A = A_D ;
}
```

FIG.6

C Model:
```
if (reset or posedgeclk32) {
    if (reset)   A_D = 0;
    else         A_D = A + B;
}
```

Verilog code:
```
            always @(posedge reset or posedge clk32)
begin
            if (reset)   A <= 16'd0;
            else begin
                         A <= A + B;
            end
end
```

METHOD FOR DIGITAL SYSTEM MODELING BY USING HIGHER SOFTWARE SIMULATOR

BACKGROUND OF THE INVENTION (a) Field of the Invention

The present invention relates to a digital system design method, and more particularly relates to a digital system design method using a higher programming language.

(b) Description of the Related Art

A conventional digital system has been designed and manufactured by establishing an algorithm and a variable through a simulation using a higher programming language, performing a simulation based on the algorithm and a variable simulated using the higher programming language using a hardware description language (HDL, hereinafter, called "a lower programming language"), performing a synthesis, place, and routing based on the lower programming language, and realizing a digital system.

The realized digital system had been verified using the lower programming language as the hardware description language, a system description language (SDL), or a combination thereof.

Initially, the digital system design method mainly uses a simulator (for example a Verilog simulator and a VHDL simulator) realized by the lower programming language as a software-approaching method. Since these simulators sequentially perform a software code on a computer, which is configured in a sequential instruction sequence by modeling an actual verification circuit and test bench in a software-manner, it takes a long time to perform a simulation for the verification.

That is, a higher software simulator as a program of the operation of the digital system is designed using a programming language such as C/C++, and MATLAB which are simulators realized by the general higher programming language. Since such a higher software simulator is written without considering hardware characteristics, it is important to verify performance of the realized digital system when the operation of the desired digital system is designed.

The desired digital system must be verified over a long time by such a higher software simulator, and then the digital system may be manufactured. When the digital system is to be manufactured, a program is written using the lower programming language, and the program written by the lower programming language is simulated by a simulator ModelSim.

However, the simulation using such a simulator takes a long verification time because it is operated when an environment of the hardware is configured. In addition, it is difficult for a simulation result of a lower software simulator using such a lower programming language to be compared to a simulation result using the higher language. In order to overcome such a problem, emulation may be accelerated, but it requires a long environment configuration time and it is difficult to repeatedly verify the corrected simulation result.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a digital system design method using a higher programming language having advantages of reducing a simulation time of a program written by a lower programming language when designing a digital system.

In addition, the present invention has been made in an effort to provide a digital system design method using a higher programming language having advantages of reducing a hardware environment configuration time by configuring a hardware environment of a to-be realized digital system by a higher programming language.

An exemplary embodiment of the present invention provides a digital system design method using a programming language, including (a) establishing an algorithm and a first variable to a desired digital system using a higher programming language; (b) configuring a similar environment as hardware of the desired digital system using a higher programming language based on the predetermined algorithm and the first variable; and (c) converting the digital system environment configured by the higher programming language into a lower programming language and realizing the converted digital system environment as the hardware. The (b) configuring a similar environment may involve forming a simulator corresponding to the hardware environment of the digital system using the higher programming language, and includes (i) performing a time concept simulation to the simulator considering an operation variance according a time of the digital system, and (ii) generating a second variable to the simulator and performing a bit unit simulation by controlling a bit number of the second variable.

BRIEF DESCRIPTION OF THE DRAWINGS

FIG. 2 is a program in which a time concept is applied to a higher programming language according to an exemplary embodiment of the present invention.

FIG. 4 illustrates an addition operation program of an occurrence clock according to an exemplary embodiment of the present invention.

FIG. 5 illustrates how to substitute an update clock from a temporally stored variable to a real value according to an exemplary embodiment of the present invention.

FIG. 6 illustrates a program including a hardware time concept using a higher software simulator according to an exemplary embodiment of the present invention and a program written using a lower software simulator.

DETAILED DESCRIPTION OF THE EMBODIMENTS

Figure 1:
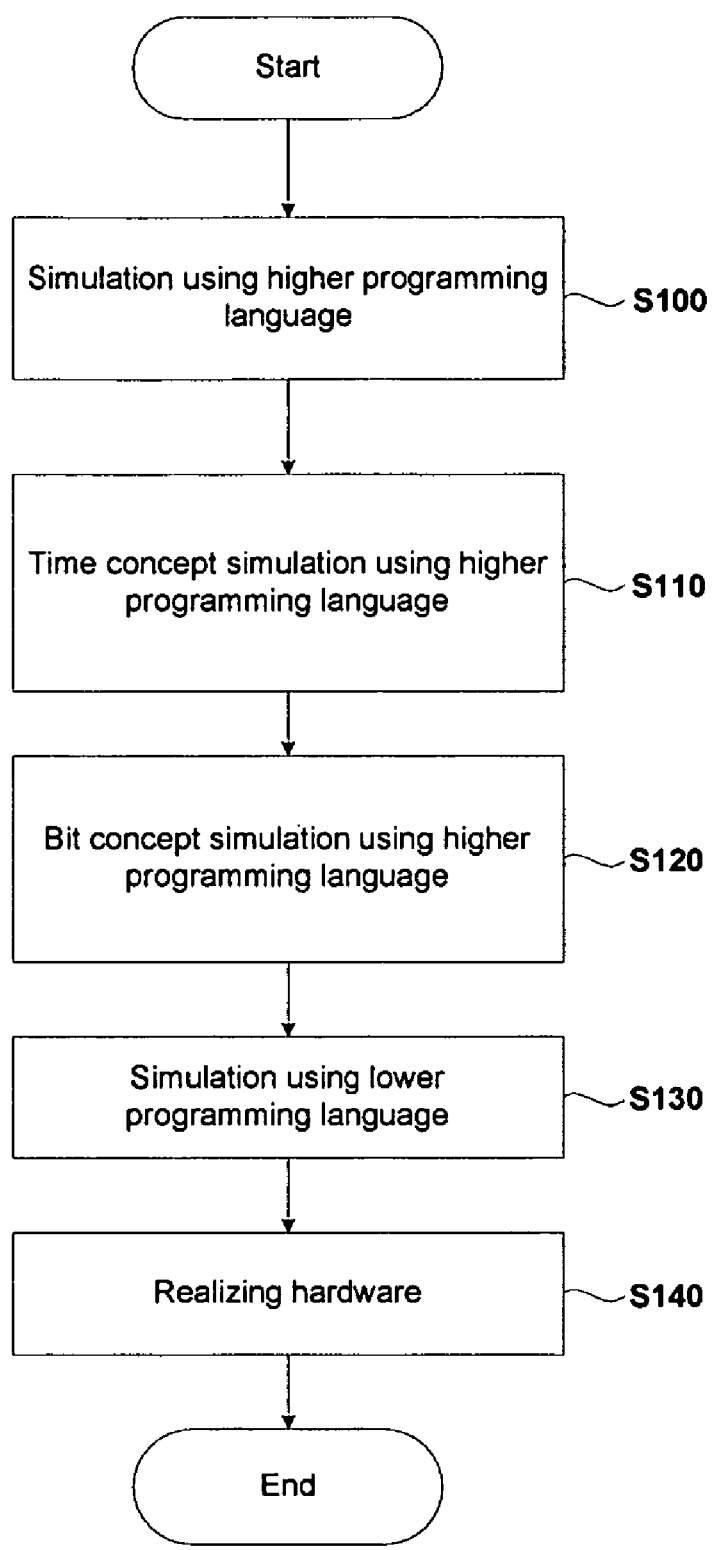
FIG. 1 is a flowchart for designing a system by applying a hardware concept to a higher programming language so as to reduce a verification time according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

When it is described that an element is coupled to another element, the element may be directly coupled to the other element or coupled to the other element through a third element.

Generally, a hardware system is designed by establishing an algorithm and a variable though a higher programming language simulation so as to define a variable of a desired system. When the higher programming language simulation is finished, a digital system simulation is performed based on the algorithm and variable using a lower programming language. When such a lower programming language simulation is finished, a synthesis, place, and routing process is performed, and accordingly, a digital system is manufactured.

According to an exemplary embodiment of the present invention, how to design a digital system is proposed so as to reduce a time for performing the lower programming language simulation of among such processes.

FIG. 1 is a flowchart for designing a system by applying a hardware concept to a higher programming language so as to reduce a verification time according to an exemplary embodiment of the present invention.

Firstly, in order to define an algorithm and a variable (a first variable) for performing a predetermined operation in a digital system, the algorithm and variable are established through a higher programming language simulation, that is, the simulation is performed using a higher language (S100).

When the simulation for establishing the algorithm and variable is finished (S100), a digital system environment to be realized using the higher programming language is configured (S110). Herein, the digital system environment includes a digital system operation time estimate, an architecture adjustment, a performance valuation, and a test pattern generation, which means that a similar environment to the digital system finally made by the hardware is configured by software. The digital system environment includes a time concept simulation (S110) and a bit unit simulation (S120), which will be described hereinafter.

When the desired digital system environment is configured using the higher programming language, the lower programming language simulation is performed (S130), which is for converting the higher programming language into the lower programming language so as to actually realize hardware. The lower programming language conversion is referred to as the lower programming language simulation. When the simulation is finished using the lower programming language, the place and routing process are performed, and the digital system is realized by the hardware (S140).

Each of ways to design a digital system will be described in detail with reference to FIG. 2 to FIG. 6.

Before the digital system is realized by the hardware, the simulation for establishing the algorithm and variable (S100) schematically illustrates a hardware system to be realized using the higher programming language. That is, the algorithm and the simulation variables of the desired digital system are established using the higher programming language. The higher programming language may include MATLAB, C, and C++. The higher programming language may be used to verify a hardware system performance.

After the simulation for establishing the algorithm and variable to the desired hardware system is finished, at the step for configuring a digital system environment S110, the similar environment to the hardware is configured using the higher programming language. In order to realize a digital system by the higher programming language digital system, two functions are desired. First, an operation variance may be described according to a time, and second, bit counting may be described by the higher language.

The time concept simulation of the step S110 using the higher language is described in detail with reference to FIG. 2 to FIG. 5.

FIG. 2 is a program in which a time concept is applied to a higher programming language according to an exemplary embodiment of the present invention.

The time concept simulation includes a hardware-operation time estimate and an architecture adjustment. A program realized by the higher programming language so as to perform the time concept simulation includes three functions as shown in FIG. 2.

Firstly, a clock_generator (a first function) portion is defined by one function for generating a clock such that following functions are performed according to a proper clock event. That is, all the clocks used in the digital system are generated by this function.

A clocked_latch (a second function) is a clock update function for updating variables changed by clocks generated based on the clock_generator function. A Phy_top (a third function) defines an actually simulated hardware operation.

How to operate according to a clock occurrence when the time concept simulation is performed based on such three functions is described in detail with reference to FIG. 3.

Figure 3:
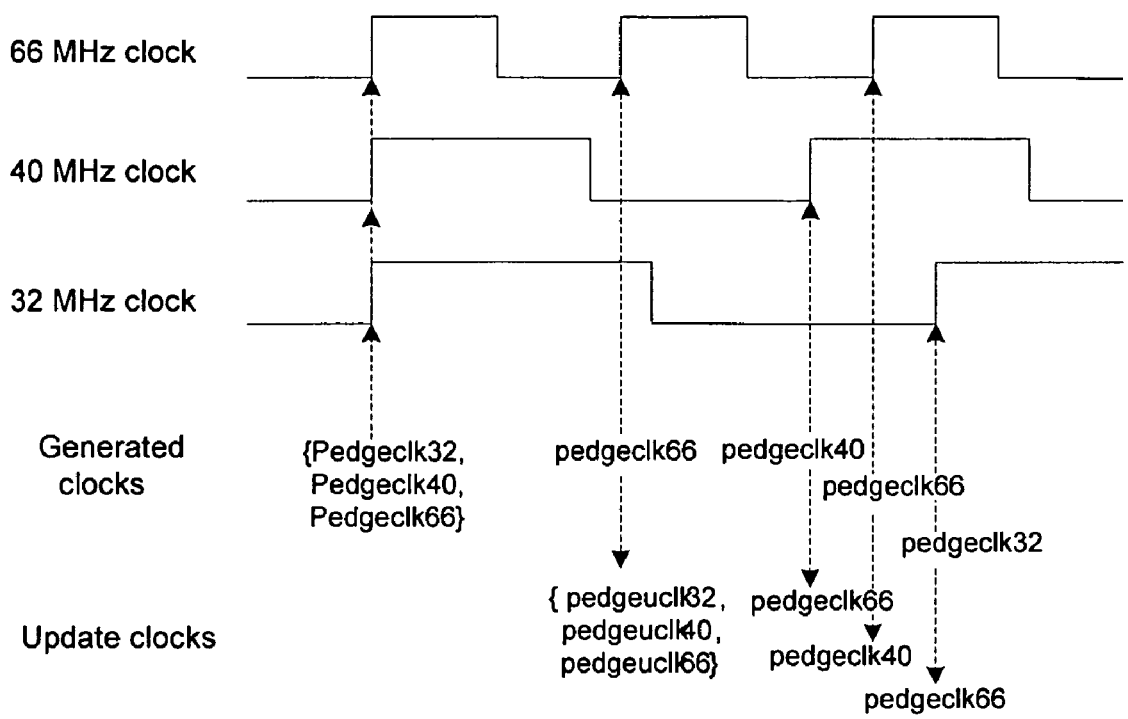
FIG. 3 illustrates a clock occurrence location according to an exemplary embodiment of the present invention.

FIG. 3 illustrates a clock occurrence location according to an exemplary embodiment of the present invention.

FIG. 3 illustrates a clock occurrence due to a positive edge trigger operation. Assuming that three clocks pedgeclk32, pedgeclk40, and pedgeclk66 simultaneously occur from a first loop by the clock_generator function of FIG. 2, the three clocks occur and then only a clock corresponding to 66 MHz is operated in a second loop, only a clock corresponding to 40 MHz is operated in a third loop, and only a clock corresponding to 66 MHz is operated in a fourth loop.

When only a clock corresponding to 66 MHz is operated in a second loop, previously occurred clocks, that is, three clocks that have occurred in the first loop are updated. At this time, the update is performed by the clocked_latch function. Likewise, in the third loop, the Pedgeclk66 corresponding to the 60 MHz clock that has occurred by the second loop is updated.

The occurred clock is replaced by a variable when the clock is properly changed in the following functions. According to an exemplary embodiment of the present invention, the following function means "Phy_top" of the program shown in FIG. 2, that is, a function for performing a simulation. The variance replacement is described with reference to FIG. 4.

FIG. 4 illustrates an addition operation program of an occurrence clock according to an exemplary embodiment of the present invention.

As shown in FIG. 4, a sum of two variables A and B is stored at a register A at a positive edge of a 32 MHz clock. At this time, the addition operation result is temporally registered at a variable entitled "_D", and the temporally stored result is stored as a value A by the clocked_latch function in an updated later clock edge.

How to replace the above-noted temporal variable value with a variable value is described with reference to FIG. 5.

FIG. 5 illustrates how to substitute an update clock from a temporally stored variable to a real value according to an exemplary embodiment of the present invention.

As shown in FIG. 5, an update clock occurrence is generated by the clocked_latch function in the same manner as the operation clock of FIG. 2. The clock occurrence had been described with reference to FIG. 3. The update clock occurrence pedgeuclk is given as a clock generated in the previously operation clock when the operation clock has occurred and then next operation clock occurs, that is, the clock_generator function is performed.

That is, as shown in FIG. 3, the clock pedgeclk66 has occurred by the clocked_latch function in the second loop, and simultaneously, the clocks pedgeclk32, pedgeclk40, and pedgeclk66 that have occurred in the first loop become update clocks pedgeuclk32, pedgeuclk40, and pedgeuclk66, and thus the clock values are updated. It may be referred to as an operation during one minimum time that the simulation is performed during one cycle of a do-loop programmed to achieve an actual operation.

Thus, it is necessary to define a time such that the loop may be operated during the simulation. At this time, a condition statement of the loop defines this operation time, and accordingly, may control that the simulation may be operated during a desired time.

After the time concept simulation as the second step of FIG. 1 is performed, the bit unit simulation steps are performed. The bit unit simulation (S120) is for applying a bit counting concept to the simulation, and may be realized in a simple format.

That is, the variables generated at the step for establishing the algorithm and variable (S100) and used in the simulation using the higher programming language are written by variable types in which a floating point value or a bit size is uniformly defined. However, the bit unit simulation step uses fixed bits although another variable (a second variable) defining a bit size of the variable is defined. It may easily use the fixed bit by correcting the clock concept-applied program.

Ultimately, when the bit-counting simulation is performed, a performance variance due to a bit variance that has occurred at the step for realizing the digital system by the hardware (S140) may be verified. Since the time simulation result of the time concept simulation (S110) and the bit concept simulation result of the bit counting simulation (S120) is the same as the result of the lower programming language simulation, they may be compared to the result of the lower programming language simulation.

The bit unit simulation will be described in detail. It is assumed that the bit unit simulation can be classified into a floating point simulation and a fixed point simulation. According to an exemplary embodiment of the present invention, the bit unit simulation means the fixed point simulation. It means that all the variables used in the hardware operation function are operated within the defined effective bit width.

When any variables are defined at the step (S100) before the bit unit simulation, the variables may be defined as integers. When the variables are defined as integers, the variables may include 32 bit information. However, the actually manufactured hardware may use only about 5 bits. At this time, the simulation may include one portion such that only LSB (least significant bit, lowermost bit) 5 bits may be truncated and used, in which the one portion is referred to as "bit unit simulation".

When the bit unit simulation is performed using the higher language, the lower programming language simulation is performed as a resist step (S130). That is, in order to actually realize hardware, the higher programming languages written through the steps S100 to S120 are converted into the lower programming language.

At the step S130, the higher programming language program written at the previous step S120 may be written into a hardware description language by a simple conversion process. This is described with reference to FIG. 6.

FIG. 6 illustrates a program including a hardware time concept using a higher software simulator according to an exemplary embodiment of the present invention and a program written using a lower software simulator.

According to an exemplary embodiment of the present invention, the higher programming language uses C language and the lower programming language uses Verilog language, but is not limited thereto. As shown in FIG. 6, the addition operation shown in FIG. 4 is converted from C language to Verilog language, and accordingly, grammatical variance is performed and the program is not largely changed.

That is, when the program is realized by C language, the program is realized in a similar manner as a Verilog language format considering the conversion of into Verilog language. Accordingly, when the hardware is realized, the user may simply convert the program written by C language into Verilog language.

Accordingly, it is not difficult for C language to be converted into the lower programming language. In addition, the program written by the lower programming language may be verified by being compared to input/output results of the program written by the higher programming language at the steps S10 and S120 of FIG. 1.

As described above, when the lower programming language simulation is finished, the last step (S140) of FIG. 1 is performed to realize hardware. At the step S140, finally the digital system is realized by the hardware through the synthesis and place and routing process using the lower programming language written at the step S130.

Meanwhile, the conventional hardware system design method had included verifying an algorithm through the higher programming language and then writing a program in the lower programming language program. In the conventional hardware system design method, there is a problem in that it takes a long time to verify an operation of the lower programming language program due to the characteristics of the programming language simulator and it takes a long time to write a new lower program and simulate the same.

However, when the programming is performed using the higher programming language considering hardware characteristics, it has many advantages in that it may be rapidly verified by rapidly correcting an algorithm variance as well as it may have the similar result as the lower programming language simulation since the higher language simulator rapidly operates.

The above-described methods and apparatuses are not only realized by the exemplary embodiment of the present invention, but, on the contrary, are intended to be realized by a program for realizing functions corresponding to the environment establishment of the exemplary embodiment of the present invention or a recording medium for recording the program.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

According to an exemplary embodiment of the present invention, in order to realize a digital system, the algorithm is verified based on the program written by the higher programming language and the program is programmed considering the higher programming language-hardware characteristics before the program is written in the lower programming language, and thus the conversion into the lower programming language may be easily performed.

In addition, the simulation time of the program written by the lower programming language may be reduced and the algorithm correcting program may be easily corrected.

What is claimed is:

1. A digital system design method using a higher programming language, comprising:

establishing an algorithm and a first variable for a desired digital system using the higher programming language;

configuring a digital system environment using the higher programming language based on the algorithm and the first variable;

performing a time based simulation to the digital system environment, including configuring a clock generator function for generating a clock signal for the digital system environment, a clock latch function for updating a clock variable value according to the clock signal, and a function for defining an operation of the digital system environment;

generating a first operation clock signal by the clock generator function;

generating a second operation clock signal by the clock generator function after the first operation clock signal is generated and a predetermined time has passed;

generating an update clock occurrence by the clock latch function when the second operation clock signal is generated;

updating the clock variable value based on the update clock occurrence; and converting the digital system environment configured by the higher programming language into a lower programming language, and implementing the desired digital system by realizing the converted digital system environment as hardware.

2. The digital system design method of claim 1, further comprising generating a second variable for the digital system environment, and performing a bit based simulation by controlling a bit number of the second variable.

3. The digital system design method of claim 1, wherein the generated first operation clock signal is stored as a temporal variable until the update clock occurrence generated by the clock latch function.

4. The digital system design method of claim 2, wherein the second variable is utilized to verify a performance variance due to a bit variance that occurs when the desired digital system is implemented.

5. The digital system design method of claim 1, wherein the digital system environment converted into the lower programming language is verified based on the digital system environment configured using the higher programming language.

6. The digital system design method of claim 1, wherein each one of the first operation clock signal and the second operation clock signal is configured to correspond to a different clock frequency.

7. The digital system design method of claim 1, further comprising generating a third operation clock signal by the clock generator function, and each one of the first operation clock signal, the second operation clock signal, and the third operation clock signal is configured to correspond to a different clock frequency.

* * * * *